(12) United States Patent
Camacho et al.

(10) Patent No.: US 7,977,782 B2
(45) Date of Patent: Jul. 12, 2011

(54) INTEGRATED CIRCUIT PACKAGE SYSTEM WITH DUAL CONNECTIVITY

(75) Inventors: Zigmund Ramirez Camacho, Singapore (SG); Jairus Legaspi Pisigan, Singapore (SG); Jose Alvin Caparas, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 472 days.

(21) Appl. No.: 11/936,532

(22) Filed: Nov. 7, 2007

(65) Prior Publication Data
US 2009/0115032 A1 May 7, 2009

(51) Int. Cl.
*H01L 23/52* (2006.01)
*H01L 23/48* (2006.01)

(52) U.S. Cl. .......... 257/692; 257/E23.043; 257/676; 438/123

(58) Field of Classification Search ........... 257/E21.506, 257/E23.031, 666, 672, 673, 676, E23.043, 257/E23.047, 696, 692; 438/123, 124
See application file for complete search history.

(56) References Cited

U.S. PATENT DOCUMENTS

| | | | |
|---|---|---|---|
| 5,197,183 A | 3/1993 | Chia et al. | |
| 5,394,010 A * | 2/1995 | Tazawa et al. | 257/686 |
| 5,554,886 A | 9/1996 | Song | |
| 5,744,827 A * | 4/1998 | Jeong et al. | 257/686 |
| 5,770,888 A | 6/1998 | Song et al. | |
| 6,337,510 B1 * | 1/2002 | Chun-Jen et al. | 257/666 |
| 6,392,295 B1 * | 5/2002 | Iwaya et al. | 257/696 |
| 6,420,779 B1 | 7/2002 | Sharma et al. | |
| 6,455,348 B1 * | 9/2002 | Yamaguchi | 438/106 |
| 6,459,148 B1 * | 10/2002 | Chun-Jen et al. | 257/692 |
| 6,559,526 B2 | 5/2003 | Lee et al. | |
| 6,803,648 B1 * | 10/2004 | Kelkar et al. | 257/676 |
| 7,023,076 B2 | 4/2006 | Khiang | |
| 7,193,298 B2 | 3/2007 | Hong et al. | |
| 7,227,249 B1 * | 6/2007 | Chiang | 257/686 |
| 7,615,859 B2 * | 11/2009 | Kim et al. | 257/696 |
| 7,714,416 B2 * | 5/2010 | Bauer et al. | 257/666 |
| 7,714,419 B2 * | 5/2010 | Camacho et al. | 257/670 |
| 7,719,094 B2 * | 5/2010 | Wu et al. | 257/666 |
| 2003/0132512 A1 | 7/2003 | Yasuda et al. | |
| 2005/0026325 A1 * | 2/2005 | Koon et al. | 438/107 |
| 2005/0186711 A1 | 8/2005 | Yee et al. | |
| 2006/0035414 A1 | 2/2006 | Park et al. | |
| 2007/0063322 A1 * | 3/2007 | Chow et al. | 257/678 |
| 2008/0036051 A1 | 2/2008 | Espiritu et al. | |

* cited by examiner

*Primary Examiner* — Chris Chu
(74) *Attorney, Agent, or Firm* — Mikio Ishimaru

(57) ABSTRACT

An integrated circuit package system includes: forming a lead having a both top contact portion and a bottom contact portion; connecting an integrated circuit die and the lead; and forming a package encapsulation, having a top side and a bottom side, over the integrated circuit die. The forming the package encapsulation includes partially exposing the top contact portion at the top side, and partially exposing the bottom contact portion along the bottom side with the bottom contact portion extending beyond a nonhorizontal portion of the package encapsulation.

18 Claims, 5 Drawing Sheets

INTEGRATED CIRCUIT PACKAGE SYSTEM WITH DUAL CONNECTIVITY

TECHNICAL FIELD

The present invention relates generally to an integrated circuit package system and more particularly to an integrated circuit package system with dual connectivity.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

In response to the demands for improved packaging, many innovative package designs have been conceived and brought to market. The multi-chip module has achieved a prominent role in reducing the board space used by modern electronics. However, multi-chip modules, whether vertically or horizontally arranged, can also present problems because they usually must be assembled before the component chips and chip connections can be tested. That is, because the electrical bond pads on a die are so small, it is difficult to test die before assembly onto a substrate. Thus, when die are mounted and connected individually, the die and connections can be tested individually, and only known-good-die ("KGD") that is free of defects is then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process yield problems.

Numerous package approaches stack multiple integrated circuit dice or package in package (PIP) or a combination. Other approaches include package level stacking or package on package (POP). Both concepts include stacking of two or more packages. KGD and assembly process yields are not an issue since each package can be tested prior to assembly, allowing KGD to be used in assembling the stack. But stacking integrated devices, package-in-package, package-on-package, or combinations thereof have assembly process difficulties caused by leaded packages having limited input and output (I/O) which limits its role 3D packaging. Current leaded packages also do not provide the flexibility to support the various integration and stacking options described earlier with the higher I/O count support.

Thus, a need still remains for an integrated circuit package system providing low cost manufacturing, improved yields, reduction of integrated circuit package dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

An integrated circuit package system includes: forming a lead having a both top contact portion and a bottom contact portion; connecting an integrated circuit die and the lead; and forming a package encapsulation, having a top side and a bottom side, over the integrated circuit die. The forming the package encapsulation includes partially exposing the top contact portion at the top side, and partially exposing the bottom contact portion along the bottom side with the bottom contact portion extending beyond a nonhorizontal portion of the package encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
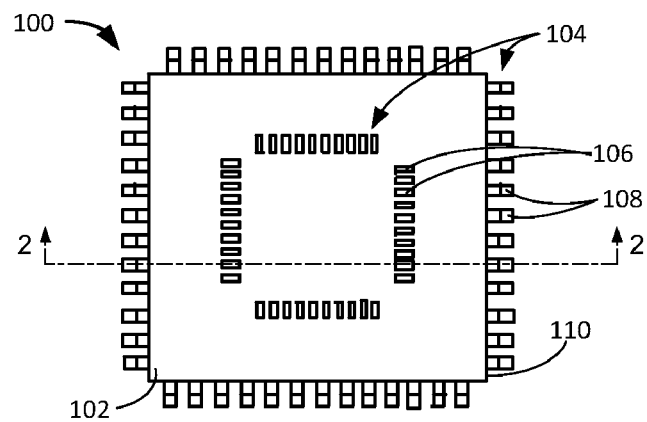
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts a package encapsulation 102, such as an epoxy molding compound, and leads 104 exposed from the package encapsulation 102. The package encapsulation 102 exposes a top contact portion 106 of the leads 104 and the top contact portion 106 is placed away from the peripheral of the package encapsulation 102. A bottom contact portion 108 of the leads 104 extends from a nonhorizontal portion 110 of the package encapsulation 102. For example, the integrated circuit package system 100 is shown as a quad flat package ("QFP") type.

For illustrative purposes, the integrated circuit package system 100 is shown with the top contact portion 106 and the bottom contact portion 108 of the leads 104 equally spaced. Although, it is understood that the integrated circuit package system 100 may have some sites depopulated such that the integrated circuit package system 100 may have the top contact portion 106, the bottom contact portion 108, or the combination thereof of the leads 104 not equally spaced.

Figure 2:
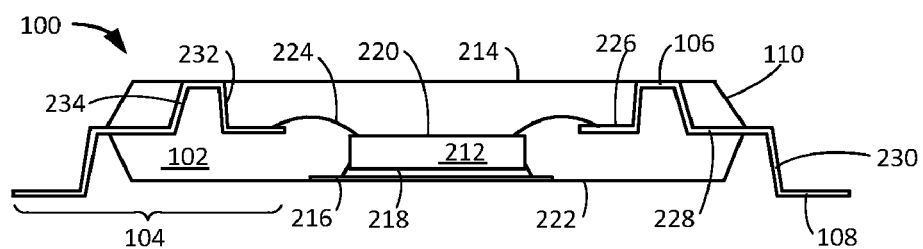
FIG. 2 is a cross-sectional view of an integrated circuit package system along line 2-2 of FIG. 1.

Referring now to FIG. 2, therein is shown a cross-sectional view of the integrated circuit package system 100 along line 2-2 of FIG. 1. The cross-sectional view depicts an integrated circuit die 212 and the leads 104 having the top contact portion 106 and the bottom contact portion 108 in the integrated circuit package system 100. The top contact portion 106 is exposed at a top side 214 of the package encapsulation 102. The integrated circuit die 212, preferably mounted over a die-attach paddle 216, has a non-active side 218 and an active side 220, wherein the active side 220 includes active circuitry fabricated thereon. In this example, the non-active side 218 is preferably facing the die-attach paddle 216. The side of the die-attach paddle 216 away from the integrated circuit die 212 is exposed from a bottom side 222 of the package encapsulation 102.

An internal interconnect 224, such as bond wire or ribbon bond wire, connects the integrated circuit die 212 and an internal contact portion 226 of the leads 104. The top contact portion 106 of the leads 104 is between the bottom contact portion 108 and the internal contact portion 226. Each of the leads 104 includes a horizontal portion 228, a vertical portion 230, a first inner vertical portion 232, and a second inner vertical portion 234. The first inner vertical portion 232 extends vertically to connect the internal contact portion 226 and the top contact portion 226. The second inner vertical portion 234 extends vertically to connect the top contact portion 226 to the horizontal portion 228. The angle between the first inner vertical portion 232 and the top contact portion 106 is different than the angle between the second inner vertical portion 234 and the top contact portion 106. The horizontal portion 228 extends from the nonhorizontal portion 110 of the package encapsulation 102 and continues to the vertical portion 230. The vertical portion 230 continues to the bottom contact portion 108 of the leads 104. The bottom contact portion 108 extends below and away from the bottom side 222 of the package encapsulation 102 for connection to the next system level (not shown), such as a printed circuit board or another integrated circuit package system.

It has been discovered that the present invention provides dual connectivity at both the top side and the bottom side of the integrated circuit package system while providing low cost and reliable method. The top contact portion of the leads can provide electrical connections with other package stacked on top of the package system of the present invention. The bottom contact portion of the lead can provide electrical connections with other packages stacked on the bottom or on the side of the package of present invention. The top contact portion and the bottom contact portion may be formed by deforming the leads by bending, pressing, or stamping the leads resulting in a low cost and reliable manufacturing process.

Figure 3:
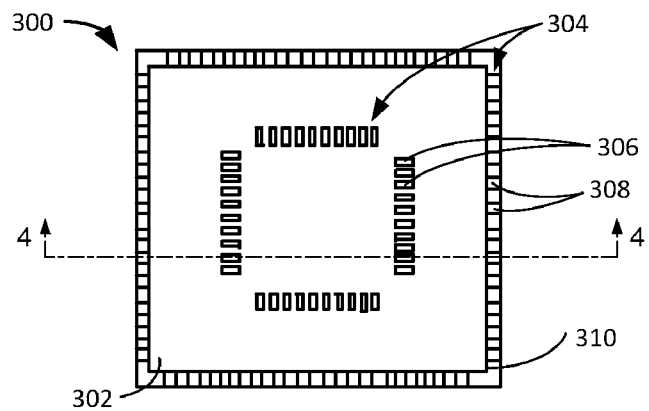
FIG. 3 is a top view of an integrated circuit package system in a second embodiment of the present invention.

Referring now to FIG. 3, therein is shown a top view of an integrated circuit package system 300 in a second embodiment of the present invention. The top view depicts a package encapsulation 302, such as an epoxy molding compound, and leads 304 exposed from the package encapsulation 302. The package encapsulation 302 exposes a top contact portion 306 of the leads 304. The top contact portion 306 is placed away from the peripheral of the package encapsulation 302. A bottom contact portion 308 of the leads 304 extends from a nonhorizontal portion 310 of the package encapsulation 302. For example, the integrated circuit package system 300 is shown as a quad flat nonleaded ("QFN") type package.

Figure 4:
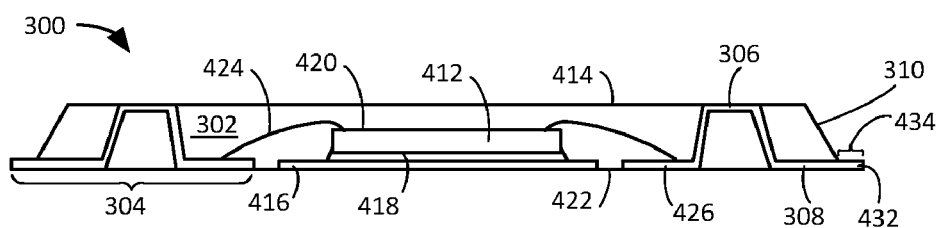
FIG. 4 is a cross-sectional view of an integrated circuit package system along line 4-4 of FIG. 3.

Referring now to FIG. 4, therein is shown a cross-sectional view of the integrated circuit package system 300 along line 4-4 of FIG. 3. The cross-sectional view depicts an integrated circuit die 412 and the leads 304 having the top contact portion 306 and the bottom contact portion 308 in the integrated circuit package system 300. The top contact portion 306 is exposed at a top side 414 of the package encapsulation 302. The integrated circuit die 412, preferably mounted over a die-attach paddle 416, has a non-active side 418 and an active side 420, wherein the active side 420 includes active circuitry fabricated thereon. In this example, the non-active side 418 is preferably facing the die-attach paddle 416. The side of the die-attach paddle 416 facing away from the integrated circuit die 412 is exposed from a bottom side 422 of the package encapsulation 302. An internal interconnect 424, such as bond wire or ribbon bond wire, connects the integrated circuit die 412 and an internal contact portion 426 of the leads 304. The top contact portion 306 of the leads 304 is between the bottom contact portion 308 and the internal contact portion 426.

A tip 432 of the bottom contact portion 308 extends beyond the nonhorizontal portion 310 of the package encapsulation 302. The bottom contact portion 308 is used for connection to the next system level (not shown), such as a printed circuit board or another integrated circuit package system. Upper portion 434 of the tip 432 may also be used to connect the integrated circuit package system 300. The upper portion 434 may be used to connect the integrated circuit package system 300 to the next system level (not shown) or may be used to mount another integrated circuit package system (not shown) thereover. The upper portion 434 provides additional connection options from the top of the integrated circuit package system 300 alleviating connection constraints.

Figure 5:
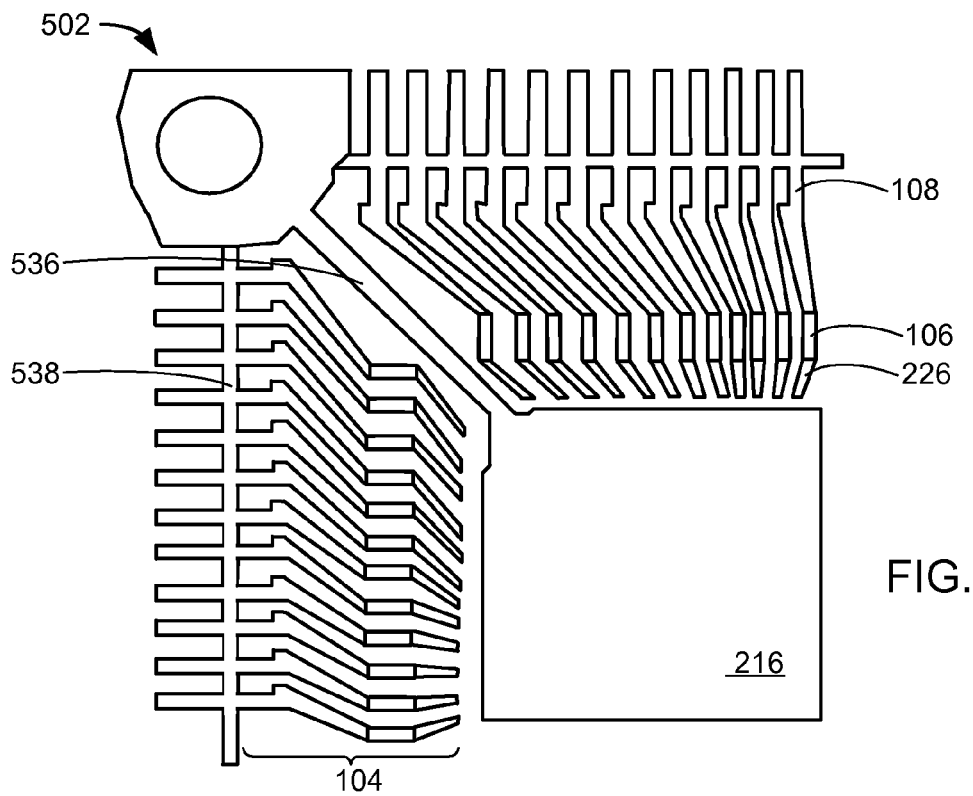
FIG. 5 is a top view of a portion of a lead frame for forming the integrated circuit package of FIG. 1.

Referring now to FIG. 5, therein is shown a top view of a portion of a lead frame 502 for forming the integrated circuit package system 100 of FIG. 1. The top view depicts the lead frame 502 at an intermediate stage of manufacturing. The top contact portion 106 of the leads 104 are elevated to be exposed from the top side 214 of FIG. 2 of the package encapsulation 102 of FIG. 1. The top contact portion 106 is between the bottom contact portion 108 and the internal contact portion 226 of the leads 104. The die-attach paddle 216 is supported by a tie bar 536. The top contact portion 106 is not from the tie bar 536. Dam bars 538 are also shown supporting the leads 104 in the lead frame 502. The dam bars 538 are removed in the manufacturing of the integrated circuit package system 100.

Figure 6:
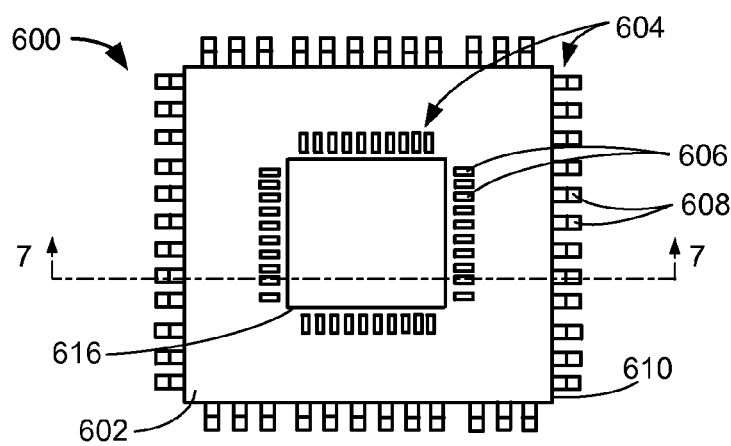
FIG. 6 is a top view of an integrated circuit package system in a third embodiment of the present invention.

Referring now to FIG. 6, therein is shown a top view of an integrated circuit package system 600 in a third embodiment of the present invention. The top view depicts a package encapsulation 602, such as an epoxy molding compound, and leads 604 exposed from the package encapsulation 602. The package encapsulation 602 exposes a top contact portion 606 of the leads 604. The top contact portion 606 is away from the peripheral of the package encapsulation 602. A bottom contact portion 608 of the leads 604 extends from a nonhorizontal portion 610 of the package encapsulation 602. The package encapsulation 602 exposes a die-attach paddle 616 surrounded by the top contact portion 606 of the leads 604. For example, the integrated circuit package system 600 is shown as a quad flat package ("QFP") type.

Figure 7:
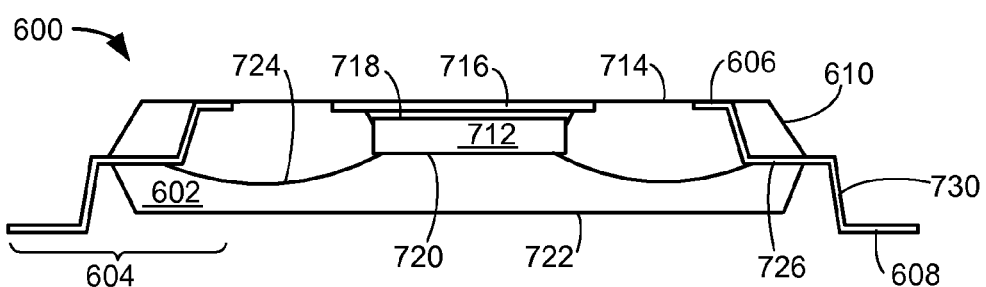
FIG. 7 is a cross-sectional view of an integrated circuit package system along line 7-7 of FIG. 6.

Referring now to FIG. 7, therein is shown a cross-sectional view of the integrated circuit package system 600 along line 7-7 of FIG. 6. The cross-sectional view depicts an integrated circuit die 712 and the leads 604 having the top contact portion 606 and the bottom contact portion 608 in the integrated circuit package system 600. The top contact portion 606 is exposed at a top side 714 of the package encapsulation 602. The integrated circuit die 712, preferably mounted under a die-attach paddle 716, has a non-active side 718 and an active side 720, wherein the active side 720 includes active circuitry fabricated thereon. In this example, the non-active side 718 is preferably facing the die-attach paddle 716. The side of the die-attach paddle 716 facing away from the integrated circuit die 712 is exposed from the top side 714 of the package encapsulation 602.

An internal interconnect 724, such as bond wire or ribbon bond wire, connects the integrated circuit die 712 and an internal contact portion 726 of the leads 604. The internal contact portion 726 of the leads 604 is between the bottom contact portion 608 and the top contact portion 606. Each of the leads 604 includes a vertical portion 730, which extends from the nonhorizontal portion 610 of the package encapsulation 602 and the internal contact portion 726. The vertical portion 730 continues to the bottom contact portion 608 of the leads 604. The bottom contact portion 608 extends below a bottom side 722 of the package encapsulation 602 for connection to the next system level (not shown), such as a printed circuit board or another integrated circuit package system.

It has been discovered that present invention provides an electromagnetic interference (EMI) shield with dual connectivity at both the top side and the bottom side of the integrated circuit package system while providing low cost and reliable method. The die-attach paddle exposed at the top side of the encapsulation may be grounded to form the EMI shield. The top contact portion of the leads can provide electrical connections with other package stacked on top of the package system of the present invention. The bottom contact portion of the lead can provide electrical connections with other packages stacked on the bottom or on the side of the package of present invention. The top contact portion and the bottom contact portion may be formed by deforming the leads by bending, pressing, or stamping the leads resulting in a low cost and reliable manufacturing process.

Figure 8:
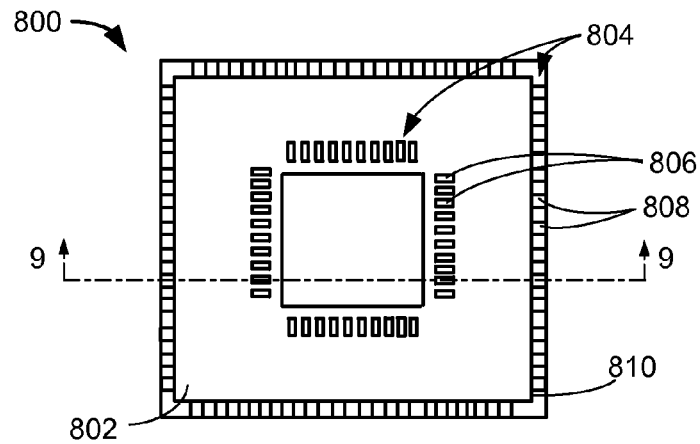
FIG. 8 is a top view of an integrated circuit package system in a fourth embodiment of the present invention.

Referring now to FIG. 8, therein is shown a top view of an integrated circuit package system 800 in a fourth embodiment of the present invention. The top view depicts a package encapsulation 802, such as an epoxy molding compound, and leads 804 exposed from the package encapsulation 802. The package encapsulation 802 exposes a top contact portion 806 of the leads 804. The top contact portion 806 is away from the peripheral of the package encapsulation 802. A bottom contact portion 808 of the leads 804 extends from a nonhorizontal portion 810 of the package encapsulation 802. For example, the integrated circuit package system 800 is shown as a quad flat nonleaded ("QFN") type package.

Figure 9:
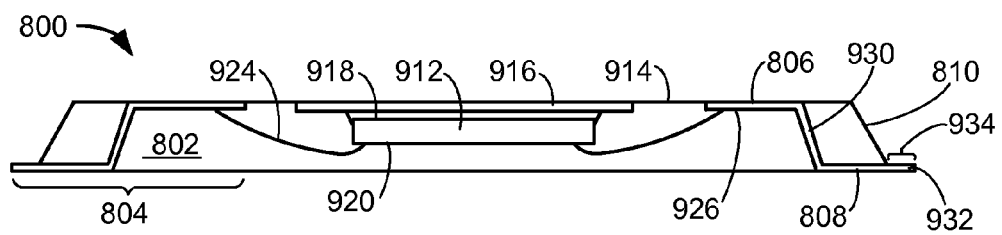
FIG. 9 is a cross-sectional view of the integrated circuit package system along line 9-9 of FIG. 8.

Referring now to FIG. 9, therein is shown a cross-sectional view of the integrated circuit package system 800 along line 9-9 of FIG. 8. The cross-sectional view depicts an integrated circuit die 912 and the leads 804 having the top contact portion 806 and the bottom contact portion 808 in the integrated circuit package system 800. The top contact portion 806 is exposed at a top side 914 of the package encapsulation 802. The integrated circuit die 912, preferably mounted over a die-attach paddle 916, has a non-active side 918 and an active side 920, wherein the active side 920 includes active circuitry fabricated thereon. In this example, the non-active side 918 is preferably facing the die-attach paddle 916. The side of the die-attach paddle 916 facing away from the integrated circuit die 912 is exposed from the top side 914 of the package encapsulation 802. The die-attach paddle 916 may be grounded forming an electromagnetic field shield.

An internal interconnect 924, such as bond wire or ribbon bond wire, connects the integrated circuit die 912 and an internal contact portion 926 of the leads 804. The internal contact portion 926 is the non-exposed side of the top contact portion 806. A vertical portion 930 of the leads 804 is between the bottom contact portion 808 and the top contact portion 806. The package encapsulation 802 covers the vertical portion 930.

A tip 932 of the bottom contact portion 808 extends beyond the nonhorizontal portion 810 of the package encapsulation 802. The bottom contact portion 808 is used for connection to the next system level (not shown), such as a printed circuit board or another integrated circuit package system. Upper portion 934 of the tip 932 may also be used to connect the integrated circuit package system 800. The upper portion 934 may be used to connect the integrated circuit package system 800 to the next system level (not shown) or may be used to mount another integrated circuit package system (not shown) thereover. The upper portion 934 provides additional connection options from the top of the integrated circuit package system 800 alleviating connection constraints.

Figure 10:
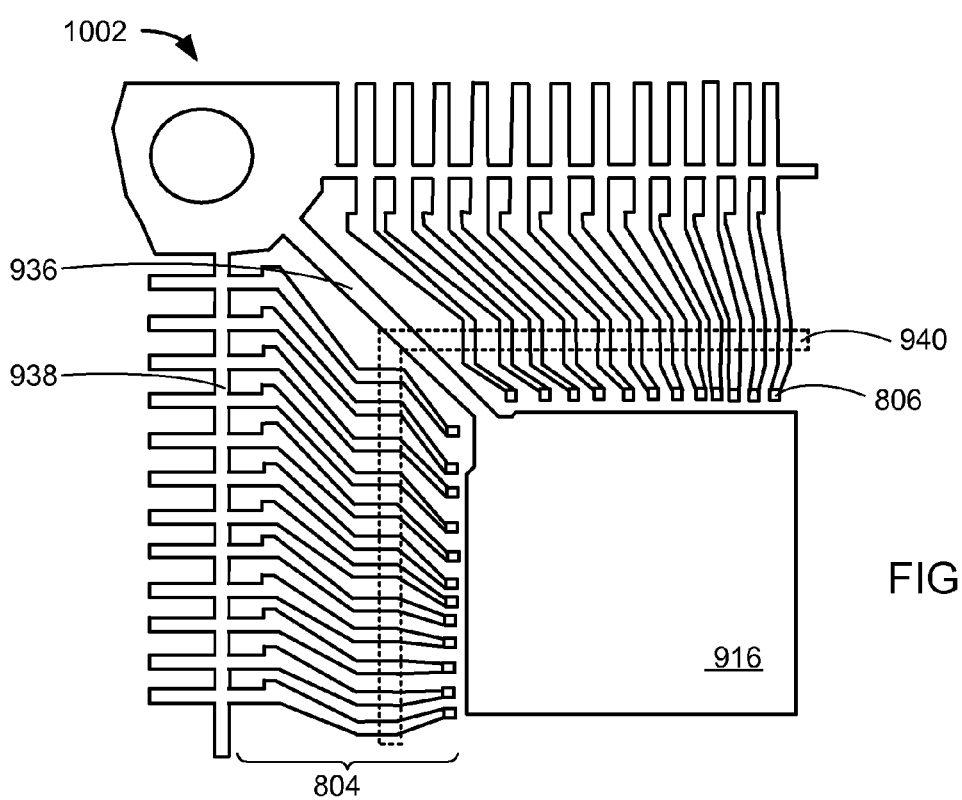
FIG. 10 is a top view of a portion of lead frame for forming the integrated circuit package of FIG. 6.

Referring now to FIG. 10, therein is shown a top view of a portion of a lead frame 1002 for forming the integrated circuit package system 600 of FIG. 6. The lead frame 1002 may also be used to form the integrated circuit package system 800 of FIG. 8. The top view depicts the lead frame 1002 at an intermediate stage of manufacturing. The top contact portion 806 of the leads 804 are elevated to be exposed from the top side 914 of FIG. 9 of the package encapsulation 802 of FIG. 8. The top contact portion 806 is at the end of the leads 804 and adjacent to the die-attach paddle 916. A lead-lock tape 940 depicted by the dotted lines may be optionally attached to the leads 804 to prevent the leads 804 from shifting during manufacturing process. The die-attach paddle 916 is supported by a tie bar 936. The top contact portion 806 is not from the tie bar 936. Dam bars 938 support the leads 804 and are removed with the manufacturing of the integrated circuit package system 600.

Figure 11:
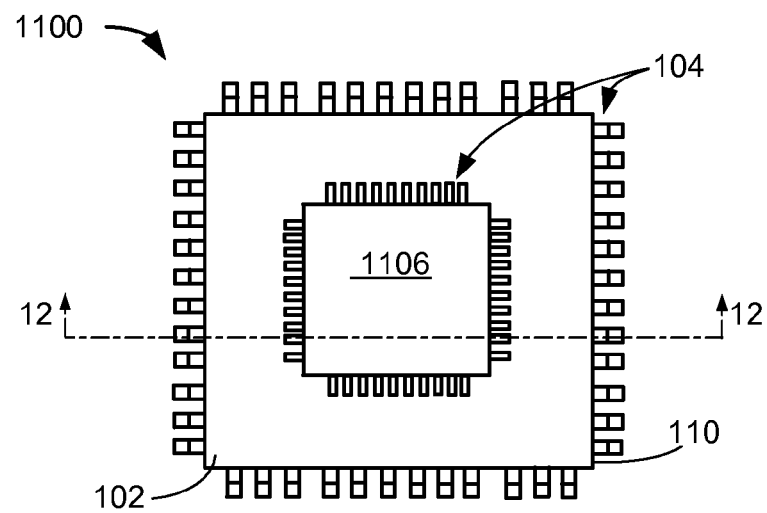
FIG. 11 is a top view of an integrated circuit package-on-package system with the integrated circuit package system of FIG. 2 in a fifth embodiment of the present invention.

Referring now to FIG. 11, therein is shown a top view of an integrated circuit package-on-package system 1100 with the integrated circuit package system 100 of FIG. 2 in a fifth embodiment of the present invention. The top view depicts a mounting integrated circuit package system 1106 stacked over the integrated circuit package system 100. The leads 104 extend from the nonhorizontal portion 110 of the package encapsulation 102.

Figure 12:
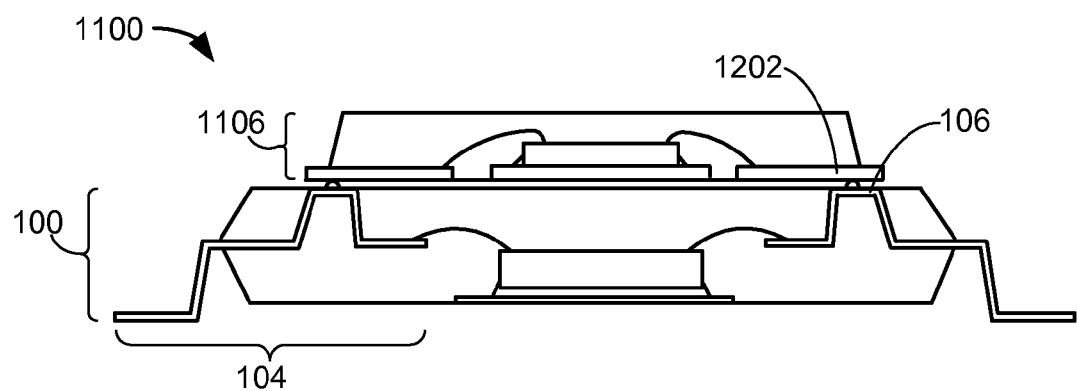
FIG. 12 is a cross-sectional view of the integrated circuit package-on-package system along line 12-12 of FIG. 11.

Referring now to FIG. 12, therein is shown a cross-sectional view of the integrated circuit package-on-package system 1100 along line 12-12 of FIG. 11. The cross-sectional view depicts the mounting integrated circuit package system 1106, such as a quad flat nonleaded ("QFN") package, stacked over the integrated circuit package system 100. A terminal pad 1202 of the mounting integrated circuit package system 1106 is shown to electrically connect to the top contact portion 106 of the leads 104 of the integrated circuit package system 100.

For illustrative purpose, the mounting integrated circuit package system 1106 is shown as a quad flat nonleaded ("QFN") type device, although it is understood that the mounting integrated circuit package system 1106 may be other types of packages. For example, the mounting integrated circuit package system 1106 may be a quad flat package ("QFP"), a small outline package ("SOP"), a ball grid array ("BGA") package, or flip chip.

Figure 13:
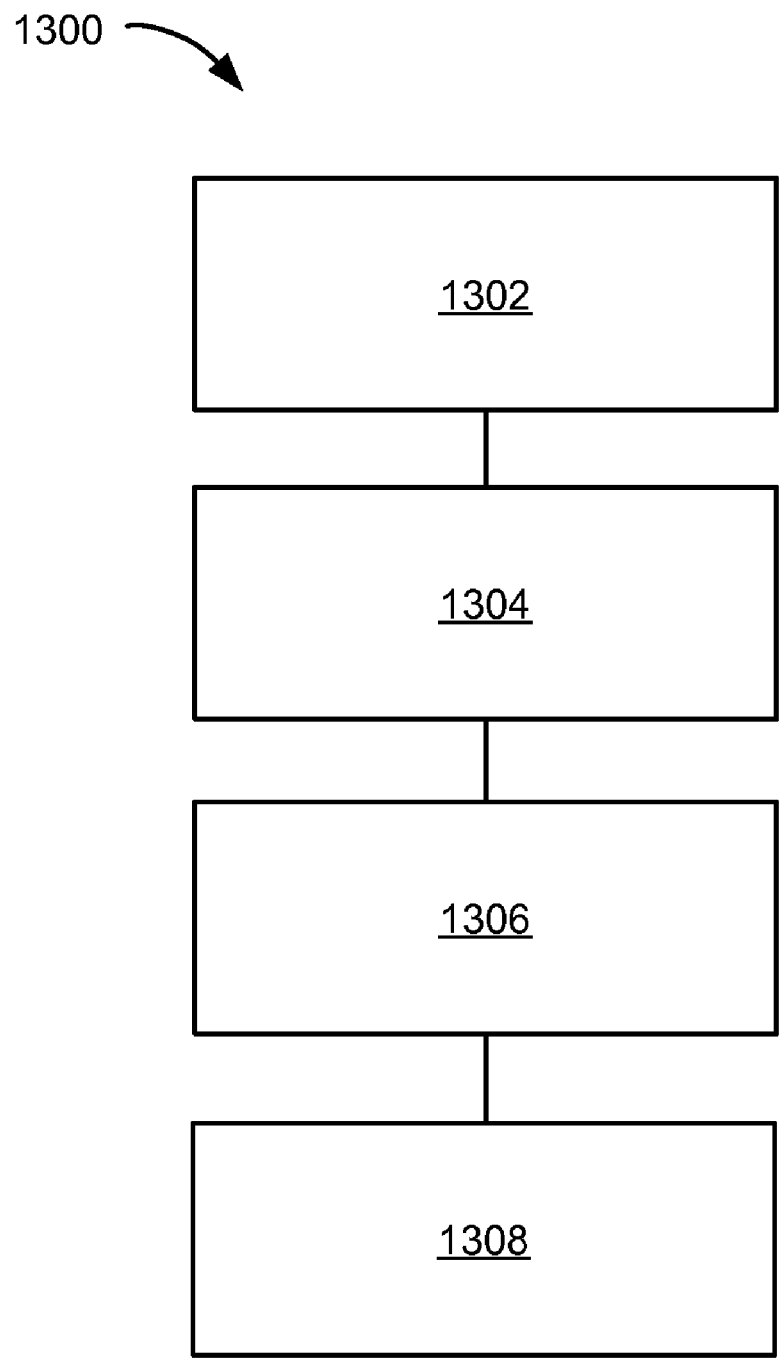
FIG. 13 is a flow chart of an integrated circuit package system for manufacturing of the integrated circuit package system in an embodiment of the present invention.

Referring now to FIG. 13, therein is shown a flow chart of an integrated circuit package system 1300 for manufacturing of the integrated circuit package system 100 in an embodiment of the present invention. The system 1300 includes forming a lead having a both top contact portion and a bottom contact portion in a block 1302; mounting the integrated circuit die to the die-attach paddle in a block 1304; connecting an integrated circuit die and the lead in a block 1306; and forming a package encapsulation over the integrated circuit die including: partially exposing the top contact portion at the top side, and partially exposing the bottom contact portion along the bottom side with the bottom contact portion extending beyond a nonhorizontal portion of the package encapsulation in a block 1308.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-in-package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    forming a lead having a top contact portion, a bottom contact portion, a first inner vertical portion, and a second inner vertical portion, with the first inner vertical portion and the second inner vertical portion both extending from the top contact portion, and the first inner vertical portion and the top contact portion having an angle different than the angle between the second inner vertical portion and the top contact portion;
    connecting an integrated circuit die and the lead; and
    forming a package encapsulation, having a top side and a bottom side, over the integrated circuit die including:
        partially exposing the top contact portion at the top side, and
        exposing the bottom contact portion below and away from the bottom side with the bottom contact portion extending beyond a nonhorizontal portion of the package encapsulation.

2. The method as claimed in claim 1 wherein connecting the integrated circuit die and the lead includes connecting the integrated circuit die and the top contact portion.

3. The method as claimed in claim 1 wherein:
forming the lead includes:
   forming an internal contact portion with the top contact portion between the bottom contact portion and the internal contact portion; and
connecting the integrated circuit die and the lead includes:
   forming the integrated circuit die and the internal contact portion.

4. The method as claimed in claim 1 wherein:
forming the lead includes:
   forming an internal contact portion between the top contact portion and the bottom contact portion; and
connecting the integrated circuit die and the lead includes:
   forming the integrated circuit die and the internal contact portion.

5. The method as claimed in claim 1 wherein:
forming the lead includes:
   forming a die-attach paddle; and
further comprising:
   mounting the integrated circuit die to the die-attach paddle.

6. A method of manufacture of an integrated circuit package system comprising:
   forming a die-attach paddle and a lead having a top contact portion, a bottom contact portion, a first inner vertical portion, and a second inner vertical portion, with the first inner vertical portion and the second inner vertical portion both extending from the top contact portion, and the first inner vertical portion and the top contact portion having an angle different than the angle between the second inner vertical portion and the top contact portion;
   mounting an integrated circuit die to the die-attach paddle;
   connecting the integrated circuit die and the lead; and
   forming a package encapsulation, having a top side and a bottom side, over the integrated circuit die including:
      partially exposing the top contact portion at the top side, and
      exposing the bottom contact portion below and away from the bottom side with the bottom contact portion extending beyond a nonhorizontal portion of the package encapsulation.

7. The method as claimed in claim 6 further comprising mounting a device over the top contact portion.

8. The method as claimed in claim 6 wherein forming the package encapsulation includes partially exposing the die-attach paddle.

9. The method as claimed in claim 6 wherein:
forming the lead includes:
   forming an internal contact portion with the top contact portion between the bottom contact portion and the internal contact portion;
connecting the integrated circuit die and the lead includes:
   forming the integrated circuit die and the internal contact portion; and
forming the package encapsulation includes:
   covering the internal contact portion.

10. The method as claimed in claim 6 wherein:
forming the lead includes:
   forming an internal contact portion between the top contact portion and the bottom contact portion;
connecting the integrated circuit die and the lead includes:
   forming the integrated circuit die and the internal contact portion; and
forming the package encapsulation includes:
   exposing the internal contact portion from the nonhorizontal portion.

11. An integrated circuit package system comprising:
a lead having a top contact portion, a bottom contact portion, a first inner vertical portion, and a second inner vertical portion, with the first inner vertical portion and the second inner vertical portion both extending from the top contact portion, and the first inner vertical portion and the top contact portion having an angle different than the angle between the second inner vertical portion and the top contact portion;
an integrated circuit die connected with the lead; and
a package encapsulation, having a top side and a bottom side, over the integrated circuit die including:
   the top contact portion partially exposed at the top side, and
   the bottom contact portion exposed below and away from the bottom side with the bottom contact portion extending beyond a nonhorizontal portion of the package encapsulation.

12. The system as claimed in claim 11 wherein:
the lead includes an internal contact portion with the top contact portion between the bottom contact portion and the internal contact portion; and
the integrated circuit die is connected with the internal contact portion.

13. The system as claimed in claim 11 wherein:
the lead includes an internal contact portion between the top contact portion and the bottom contact portion; and
the integrated circuit die is connected with the internal contact portion.

14. The system as claimed in claim 11 further comprising a die-attach paddle and the integrated circuit die mounted thereto.

15. The system as claimed in claim 11 further comprising:
a die-attach paddle and the integrated circuit die mounted thereto; and
an internal interconnect between the integrated circuit die and the lead.

16. The system as claimed in claim 15 further comprising a device over the top contact portion.

17. The system as claimed in claim 15 wherein the package encapsulation partially exposes the die-attach paddle.

18. The system as claimed in claim 15 wherein:
the lead includes an internal contact portion with the top contact portion between the bottom contact portion and the internal contact portion;
the integrated circuit die is connected with the internal contact portion; and
the package encapsulation covers the internal contact portion.

* * * * *